United States Patent
Lai et al.

(10) Patent No.: US 7,499,275 B2
(45) Date of Patent: Mar. 3, 2009

(54) ELECTRONIC APPARATUS HAVING A DETACHABLE FILTER

(75) Inventors: Hsing-Wen Lai, Hsinchu County (TW); Chin-Hung Lien, Taoyuan County (TW); Chih-Chan Chiang, Hsinchu County (TW)

(73) Assignee: ZyXEL communications Corp., Hsinchu (TW)

( * ) Notice: Subject to any disclaimer, the term of this patent is extended or adjusted under 35 U.S.C. 154(b) by 0 days.

(21) Appl. No.: 11/781,270

(22) Filed: Jul. 22, 2007

(65) Prior Publication Data
US 2009/0021910 A1   Jan. 22, 2009

(51) Int. Cl.
*H05K 7/20* (2006.01)
*H01L 23/36* (2006.01)

(52) U.S. Cl. .................. 361/695; 361/690; 361/692; 454/184

(58) Field of Classification Search ......... 361/690–697, 361/687, 727, 801, 812, 816, 818, 831; 55/385.1, 55/385.6, 423, 479, 482, 483, 493, 524; 454/184, 454/185, 187; 174/35 R, 35 MS, 35 GC, 174/50; 312/223.2, 223.3; 210/488, 489, 210/498
See application file for complete search history.

(56) References Cited

U.S. PATENT DOCUMENTS

| | | | | |
|---|---|---|---|---|
| 4,961,849 A | * | 10/1990 | Hull et al. | 210/232 |
| 5,163,870 A | * | 11/1992 | Cooper | 454/184 |
| 5,600,090 A | * | 2/1997 | Morris | 174/17 VA |
| 5,827,340 A | * | 10/1998 | Fiske | 55/385.6 |
| 5,935,282 A | * | 8/1999 | Lin | 55/385.6 |
| 6,492,947 B2 | * | 12/2002 | Anderson | 343/700 MS |
| 6,676,505 B2 | * | 1/2004 | Behl | 454/184 |
| 6,776,706 B2 | * | 8/2004 | Kipka et al. | 454/184 |
| 6,800,106 B2 | * | 10/2004 | Cogar et al. | 55/385.6 |
| 2002/0163789 A1 | * | 11/2002 | Yu-che et al. | 361/812 |
| 2007/0245701 A1 | * | 10/2007 | Su | 55/490 |
| 2008/0115473 A1 | * | 5/2008 | Miller | 55/385.6 |

FOREIGN PATENT DOCUMENTS

JP         405343875 A    * 12/1993

* cited by examiner

*Primary Examiner*—Michael V Datskovskiy
(74) *Attorney, Agent, or Firm*—Winston Hsu

(57) ABSTRACT

A detachable filter of the electronic apparatus can be positioned to the side of the housing of the electronic apparatus in a lateral way. With the help of fixing elements such as the supporters having arches or the magnetic elements adhering to the side of the detachable filter, the detachable filter can be positioned to the side of the housing laterally and fixed to the side of the housing tightly in an easy way. The detachable filter can be removed for cleaning by directly being drawn laterally along the side of the housing without the need to shutdown the electronic apparatus.

10 Claims, 6 Drawing Sheets

ELECTRONIC APPARATUS HAVING A DETACHABLE FILTER

BACKGROUND OF THE INVENTION

1. Field of the Invention

The present invention relates to an electronic apparatus, and more specifically, to an electronic apparatus having a detachable filter.

2. Description of the Prior Art

For high performance electronic apparatuses such as a network server, a personal computer, a mainframe computer, a workstation, or a switch router, a huge amount of heat is generated during operation of the apparatuses. Since in such electronic apparatuses, the motherboard or backplane and a number of daughterboards or module cards that extend in planes generally perpendicular to the plane of the motherboard are thermal-sensitive, it is necessary to provide a heat dissipation device, such as the widely implemented cooling fans or blowers, for directing a current of air through the apparatuses and bringing out the heat generated by the apparatuses or otherwise permanent damage to the apparatuses may occur.

Typically a plurality of cooling fans or blowers for drawing out air are mounted at one side of the electronic apparatus' chassis, and at the opposite side of the chassis are some openings (inlet vents) for air to flow into the apparatus. However, the air blown through the apparatus needs to be filtered in order to be free of foreign materials such as dust, dirt, corrosion products, lint, etc. for the apparatus. Some conventional electronic apparatuses only have a panel of cellular openings at the air inhaling side of the chassis and are incapable of filtering foreign materials smaller than the diameter of the cellular openings of the panel. Another conventional electronic apparatus utilizes an air filter mounted at the air inhaling side of the chassis for effectively filtering most foreign materials. However, replacement of the air filter in the conventional method generally leads to downtime of the system since the air filter is mounted on the chassis with screws.

SUMMARY OF THE INVENTION

The present invention provides an electronic apparatus, which comprises a housing having a first side and a second side, wherein the second side has a plurality of first holes, a heat dissipater configured at the first side for drawing air out of the housing, a detachable filter positioned to the second side, and a fixing element configured between the second side and the detachable filter for attaching the detachable filter on the second side. The detachable filter has a plurality of second holes with dimensions smaller than those of the first holes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
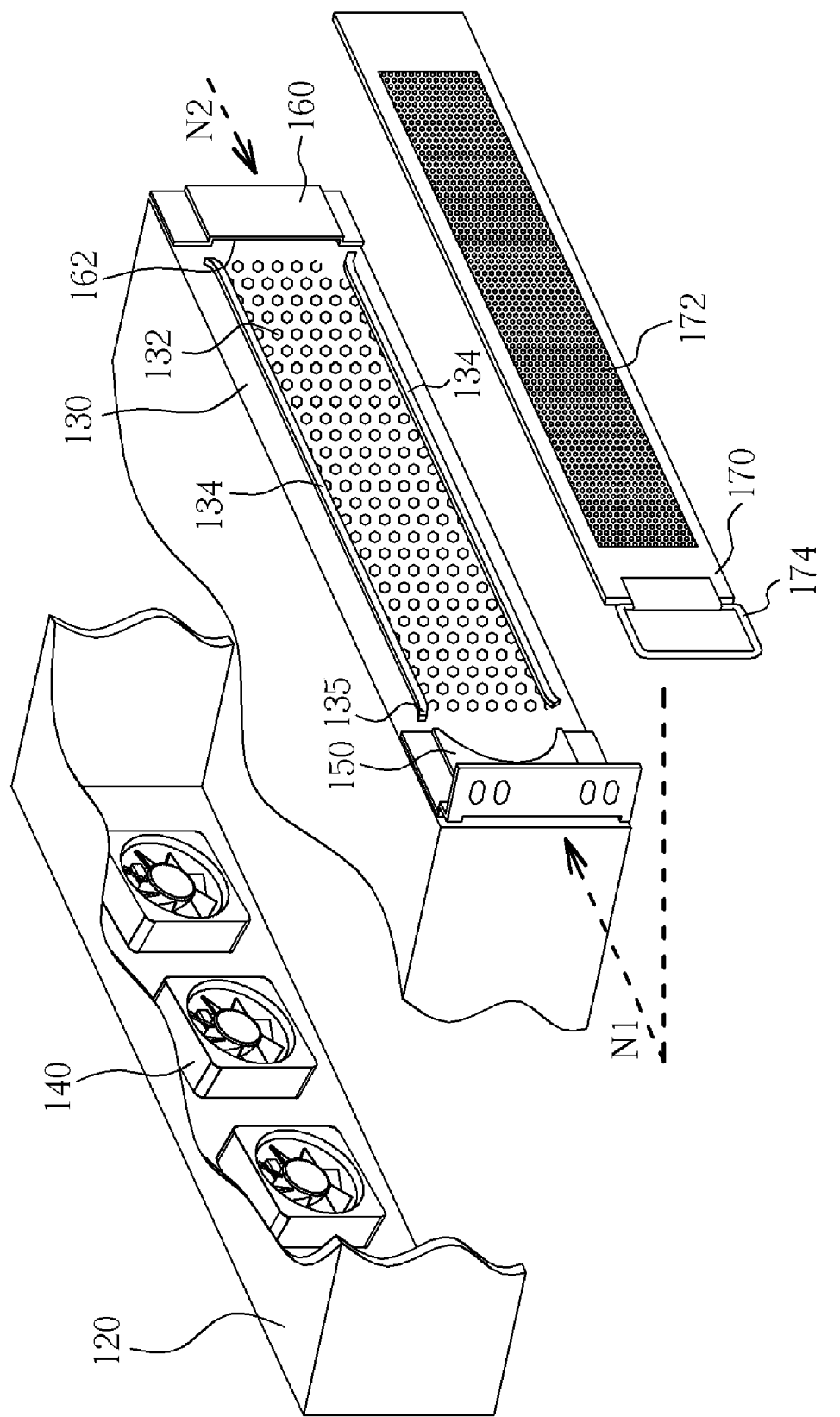
FIG. 1 is an illustration of a first exemplary embodiment of the electronic apparatus having a detachable filter according to the present invention.
Figure 2:
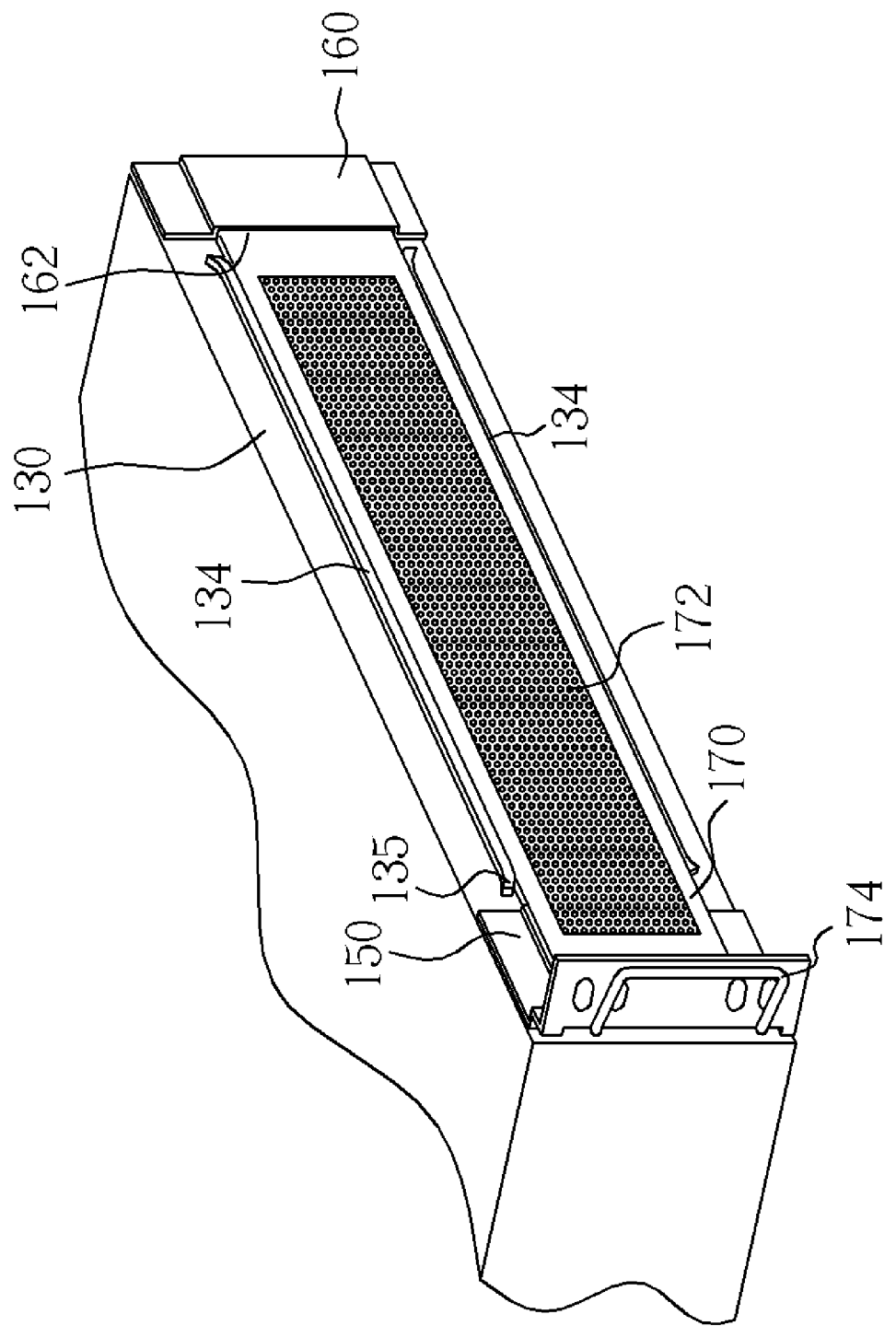
FIG. 2 is the perspective view of the first exemplary embodiment of the electronic apparatus incorporating the detachable filter.

Please refer to FIG. 1, which is an illustration of the first exemplary embodiment of the present invention that forms part of an electronic apparatus 100. FIG. 2 shows an assembled illustration of part of the electronic apparatus 100 with the detachable filter 170 incorporated. The electronic apparatus 100 comprises a housing 110 where the motherboard, a number of daughterboards or module cards and other electronic components (not shown) are contained for functioning as a network server, a personal computer, a mainframe computer, a workstation, a switch router, or any other type of computing apparatus that generates heat during operation. In the exemplary embodiments disclosed in the figures of the present invention, the housing 110 is exemplified as a rack chassis (or shelf, or subrack) with default dimensions for use in a rack cabinet. Nevertheless, in other exemplary embodiments of the present invention, the housing 110 can also be an up-standing chassis implemented in an up-standing personal computer. The electronic apparatus 100 further comprises one or more cooling fans or blowers 140 (as heat dissipaters) mounted at a first side 120 of the housing 110. At a second side 130 of the housing 110, which is opposite to the first side 120, a plurality of first holes 132 are arranged in a cellular form to allow air to be drawn in while the cooling fans 140 at the first side 120 direct a current of air with heat generated by the electronic apparatus 100 out of the housing 110.

Figure 3:
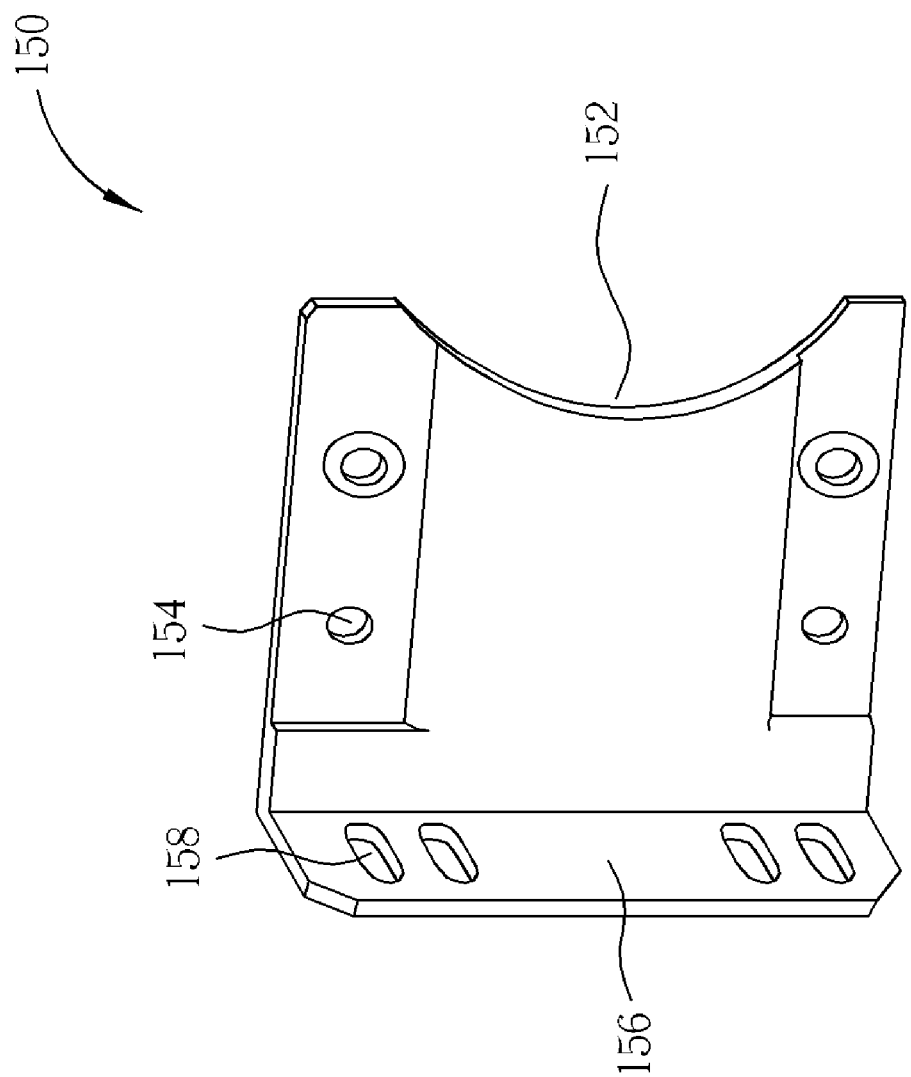
FIG. 3 is an illustration of a first exemplary embodiment of the fixing element according to the present invention.

The electronic apparatus 100 further comprises a first supporter 150 and a second supporter 160, which are fixing elements that hold a detachable filter 170 on the second side 130 of the housing 110. The first supporter 150 has a plurality of screw holes 154 and a plurality of screw holes 158 at the rack panel 156, as shown in FIG. 3. When the screws (not shown in the figures) lock the first supporter 150 through the screw holes 154, the first supporter 150 is fixed on the second side 130 of the housing 110 and provides an arch 152 so that the detachable filter 170 can pass through the first supporter 150 and be held by the first supporter 150. Another first supporter 150 is introduced in the exemplary embodiment and configured on the first side 120 of the housing 110 but is not shown in the figure for clarity consideration. The screw holes 158 at the rack panel 156 of both the first supporters 150 allow the first supporters 150 to be fixed on a rack cabinet via some screws and therefore the electronic apparatus 100 can be installed on the rack cabinet (together with other electronic apparatuses such that they are stacking in a rack). The second supporters 160 in the exemplary embodiment are welded on the second side 130 of the housing 110, as shown in FIG. 1 and FIG. 2, and thus provide an arch 162 so that the detachable filter 170 can pass through the second supporter 160 and be held by the second supporter 160. The electronic apparatus 100 further comprises two protrusions 134 (as a guider) positioning in parallel on the second side 130 of the housing 110, each forming a bell shape 135 at the both ends.

In the exemplary embodiment of the electronic apparatus 100, the detachable filter 170 has a plurality of second holes 172 with smaller dimensions than those of the first holes 132; therefore, when the detachable filter 170 is placed on the second side 130 of the housing 110, the smaller second holes 172 can block most dust or foreign materials that could have been drawn through the first holes 132 and into the housing 110 when the cooling fans 140 at the first side 120 direct the current of air with heat generated by the electronic apparatus 100 out of the housing 110. FIG. 1 shows that the detachable filter 170 according to the exemplary embodiment is positioned to the second side 130 in a lateral way either from the arch 152 of the first supporter 150 in the direction N1 or from the arch 162 of the second supporter 160 in the direction N2. When the detachable filter 170 is laterally positioned to the second side 130, it is guided in between the two protrusions 134 with the help of the bell shapes 135 at the ends of the protrusions 134 and guided by the two protrusions 134 until the detachable filter 170 reaches to and is held by the other supporter. In such way, the present invention provides an easy way for installing the detachable filter 170 on the second side 130 of the housing 110, and finally, the first supporter 150 and the second supporter 160 hold the detachable filter 170 to the second side 130.

The present invention also provides an easy way for cleaning the dust or foreign materials on the detachable filter 170. The detachable filter 170 can be removed from the housing 110 by pulling a handle 174 and the detachable filter 170 is laterally drawn along the direction N1 or N2. The electronic apparatus 100 does not have to be shutdown for replacement or cleaning of the detachable filter 170. The handle 174 is configured at the edge of the detachable filter 170 in a rotatable way such that when the detachable filter 170 is positioned to the second side 130 of the housing 110 from the arch 152 of the first supporter 150 in the direction N1, the handle 174 can be rotated to abut to the rack panel 156 and not protrude out of the rack panel 156.

Figure 4:
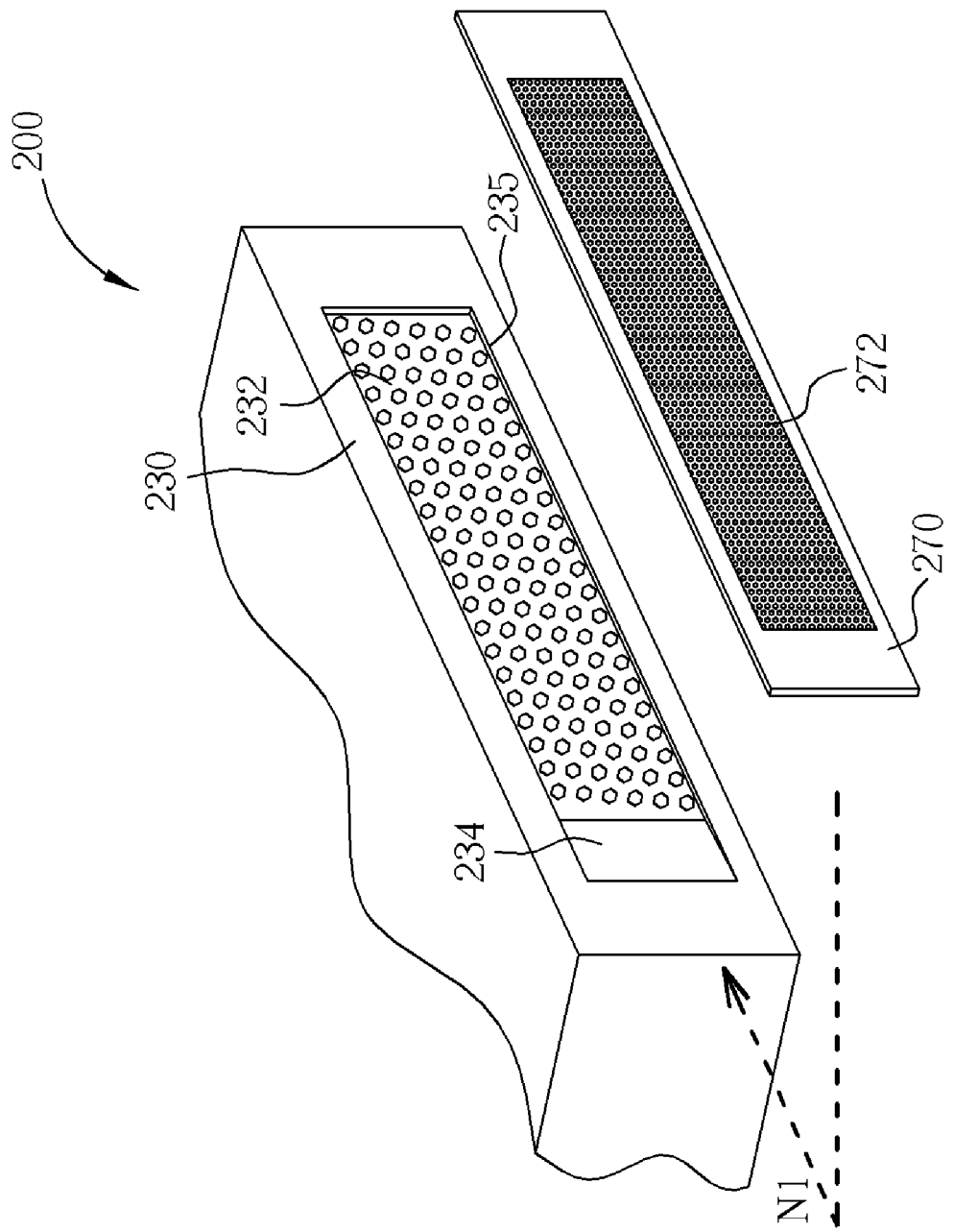
FIG. 4 is an illustration of a second exemplary embodiment according to the present invention.

Please refer to FIG. 4 for a second exemplary embodiment of the present invention. In the second exemplary embodiment, the second side 230 of the electronic apparatus 200 comprises a plurality of first holes 232 located in an indent 235, and the detachable filter 270 comprises a plurality of second holes 272. Similar to the aforementioned first exemplary embodiment, the detachable filter 270 can block most dust or foreign materials from the electronic apparatus 200 since the dimension of the second holes 272 is much smaller than that of the first holes 232. The indent 235 has a shape that the detachable filter 270 can exactly fit into. The shape may be rectangular corresponding to the shape of the detachable filter 270 in the exemplary embodiment. An inclined plane 234 at one side of the indent 235 allows the detachable filter 270 for sliding along the direction N1 into the indent 235 of the second side 230 and provides an easy way for detaching the detachable filter 270 from the electronic apparatus 200 by drawing the detachable filter 270 along the inclined plane 234.

Figure 5:
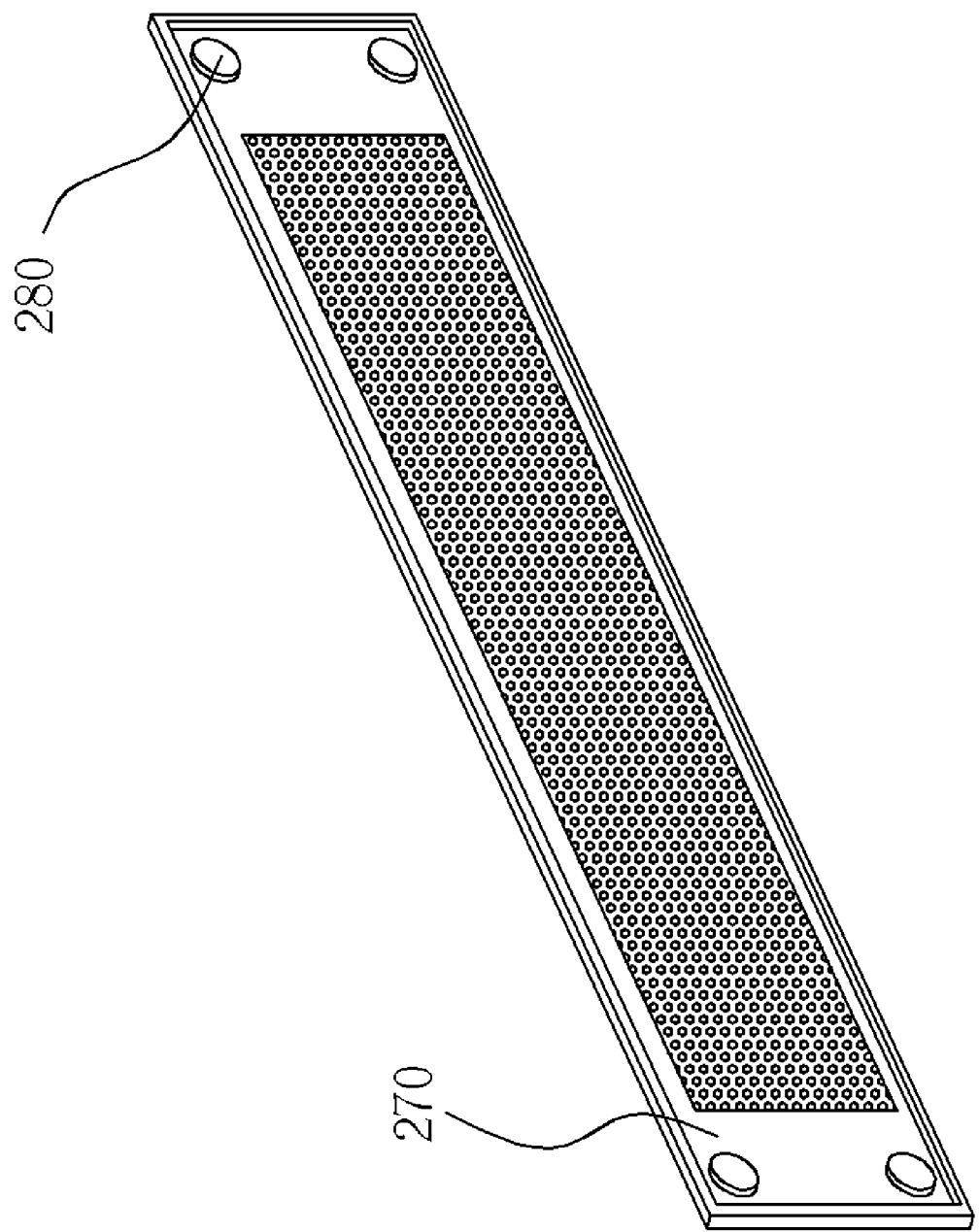
FIG. 5 is an illustration of an exemplary embodiment of the detachable filter incorporating a second exemplary embodiment of the fixing element.

Please also refer to FIG. 5. In the second exemplary embodiment, the detachable filter 270 is not held to the second side 230 by supporters like in the first exemplary embodiment but by a plurality of magnetic elements 280 configured between the second side 230 and the detachable filter 270. In the second exemplary embodiment, the plurality of magnetic elements 280 (as fixing elements) are adhered to the side of the detachable filter 270 that faces the second side 230. When the detachable filter 270 is laterally positioned to the second side 230 along the inclined plane 234, the plurality of the magnetic elements 280 sticks the detachable filter 270 to the second side 230 until fully fitting in the indent 235 and holds the detachable filter 270 to the indent 235. The magnetic elements 280 can also be used in the first exemplary embodiment in a similar way as in the second exemplary embodiment by adhering the magnetic elements 280 to the side of the detachable filter 170 that faces the second side 130 so that the detachable filter 170 can be positioned to the second side 130 even more tightly.

Figure 6:
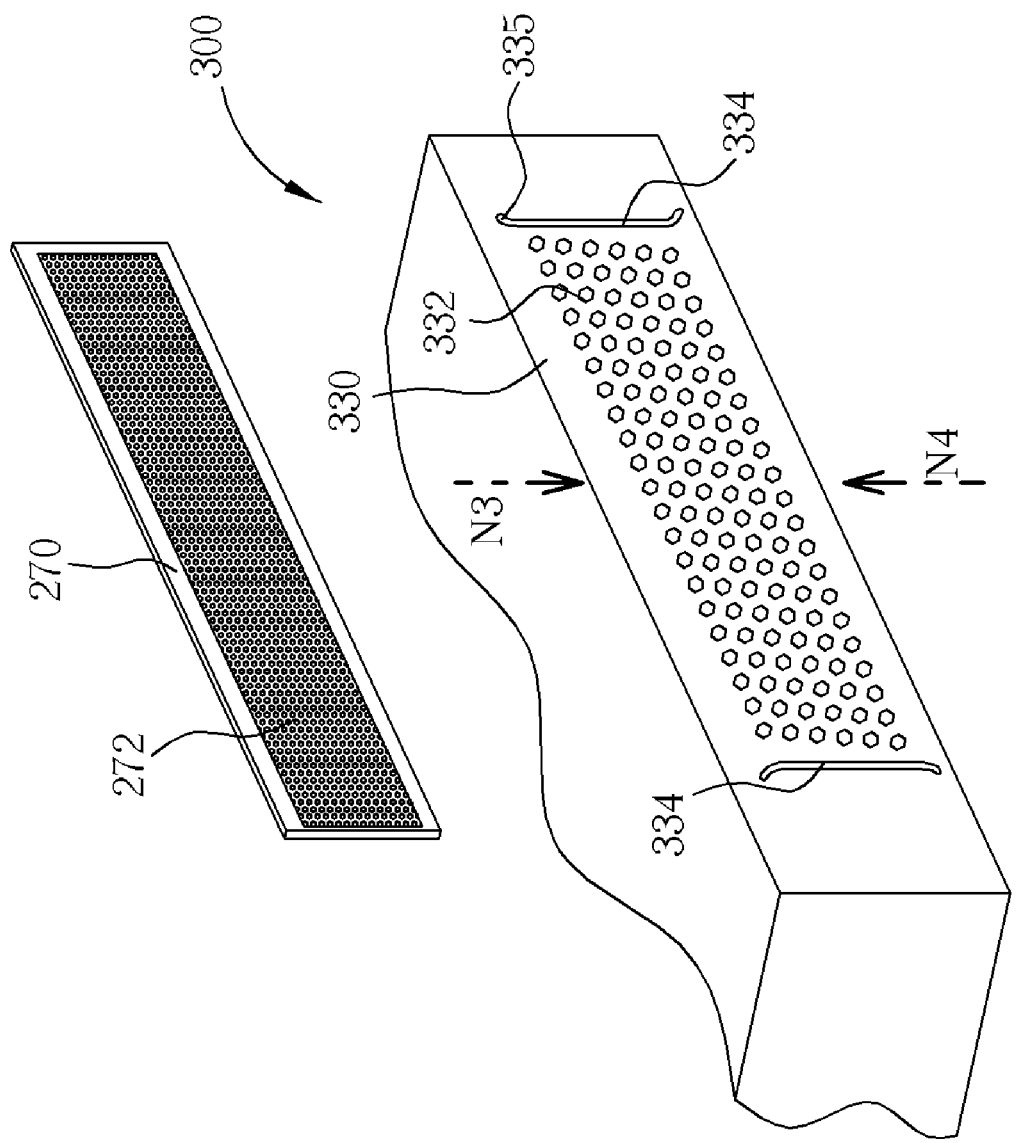
FIG. 6 is an illustration of a third exemplary embodiment according to the present invention.

Please refer to FIG. 6 for a third exemplary embodiment, which discloses yet another way for the detachable filter 270 to position to the side 330 of the electronic apparatus 300 laterally. The detachable filter 270 is similar to that in the second exemplary embodiment and is positioned to the side 330 along the direction N3 or N4 as shown in FIG. 6. For the electronic apparatus 300 without further forging an indent on the side 330 like the indent 235 in the second exemplary embodiment or using supporters at the edges of the side 330 like the supporters 150,160 for holding the detachable filter 270, the detachable filter 270 can simply laterally position to the side 330 by being guided in between the two protrusions 334 with the help of the bell shapes 335 at the ends of the protrusions 334, guided by the two protrusions 234, and held to the side 330 with the help of the magnetic elements (not shown in the figure) as in the second exemplary embodiment.

The present invention discloses an electronic apparatus having a detachable filter that can be positioned to the side of the housing of the electronic apparatus in a lateral way. With the help of fixing elements such as the supporters having arches or the magnetic elements adhering to the side of the detachable filter, the detachable filter can be positioned to the side of the housing laterally and fixed to the side of the housing tightly in an easy way. The detachable filter can be removed for cleaning by directly being drawn laterally along the side of the housing without the need to shutdown the electronic apparatus.

Those skilled in the art will readily observe that numerous modifications and alterations of the device and method may be made while retaining the teachings of the invention.

What is claimed is:

1. An electronic apparatus, comprising:
    a housing having a first side and a second side, wherein the second side has a plurality of first holes and a guider;
    a heat dissipater configured at the first side for drawing air out of the housing;
    a detachable filter laterally positioned to the second side, having a plurality of second holes, wherein the dimension of the second holes is smaller than the dimension of the first holes, the guider guiding the detachable filter when the detachable filter is laterally positioned to the second side; and
    a fixing element for attaching the detachable filter on the second side.

2. The electronic apparatus of claim 1, wherein the guider forms a bell shape at both ends.

3. The electronic apparatus of claim 1, wherein the guider comprises two parallel protrusions.

4. The electronic apparatus of claim 1, wherein the fixing element has an arch for allowing the detachable filter to pass through when laterally positioned to the second side.

5. The electronic apparatus of claim 1, wherein the fixing element is a magnetic element.

6. The electronic apparatus of claim 1, wherein the housing further comprises an inclined plane at the second side for the detachable filter being laterally detached from the second side at the inclined plane.

7. The electronic apparatus of claim 1, wherein the heat dissipater is a fan or a blower.

8. An electronic apparatus, comprising:
    a housing having a first side and a second side, wherein the second side has a plurality of first holes;
    a heat dissipater configured at the first side for drawing air out of the housing;

a detachable filter positioned to the second side, comprising:
  a handle rotatably connected at one edge of the detachable filter; and
  a plurality of second holes, wherein the dimension of the second holes is smaller than the dimension of the first holes; and
a fixing element for attaching the detachable filter on the second side.

9. The electronic apparatus of claim 8, wherein the fixing element is configured between the second side and the detachable filter.

10. The electronic apparatus of claim 1, wherein the fixing element is configured between the second side and the detachable filter.

* * * * *